(12) United States Patent
Chuang

(10) Patent No.: US 8,455,950 B2
(45) Date of Patent: Jun. 4, 2013

(54) ESD DIODE WITH PSD PARTIALLY OVERLYING P-EPI CIRCUMFERENTIAL OF PSD

(75) Inventor: Ming-Yeh Chuang, McKinney, TX (US)

(73) Assignee: Texas Instruments Incorporated, Dallas, TX (US)

( * ) Notice: Subject to any disclaimer, the term of this patent is extended or adjusted under 35 U.S.C. 154(b) by 224 days.

(21) Appl. No.: 13/094,955

(22) Filed: Apr. 27, 2011

(65) Prior Publication Data

US 2011/0298092 A1  Dec. 8, 2011

Related U.S. Application Data

(60) Provisional application No. 61/351,605, filed on Jun. 4, 2010.

(51) Int. Cl.
*H01L 27/02* (2006.01)
(52) U.S. Cl.
USPC .................. 257/355; 257/546; 257/E29.019
(58) Field of Classification Search
None
See application file for complete search history.

(56) References Cited

U.S. PATENT DOCUMENTS

| | | |
|---|---|---|
| 4,939,616 A | 7/1990 | Rountree |
| 5,060,037 A | 10/1991 | Rountree |
| 5,903,032 A | 5/1999 | Duvvury |
| 6,064,249 A | 5/2000 | Duvvury et al. |
| 6,462,380 B1 | 10/2002 | Duvvury et al. |
| 6,781,204 B1 | 8/2004 | Duvvury et al. |
| 7,145,204 B2 | 12/2006 | Duvvury et al. |
| 7,277,263 B2 | 10/2007 | Duvvury et al. |
| 7,368,786 B2 * | 5/2008 | Xu et al. .................... 257/343 |
| 8,193,560 B2 * | 6/2012 | Gendron et al. ............. 257/173 |
| 8,198,703 B2 * | 6/2012 | Lin et al. .................... 257/603 |
| 2003/0168701 A1 | 9/2003 | Voldman |
| 2006/0186467 A1 | 8/2006 | Pendharkar et al. |
| 2006/0214222 A1 | 9/2006 | Challa et al. |
| 2008/0012044 A1 | 1/2008 | Salcedo et al. |
| 2009/0230426 A1 | 9/2009 | Carpenter, Jr. et al. |
| 2010/0044750 A1 | 2/2010 | Imahashi |
| 2010/0193868 A1 | 8/2010 | Mollat et al. |

* cited by examiner

*Primary Examiner* — Benjamin Sandvik
(74) *Attorney, Agent, or Firm* — Lawrence J. Bassuk; W. James Brady; Frederick J. Telecky, Jr.

(57) ABSTRACT

An integrated circuit structure includes a semiconductor doped area (NWell) having a first conductivity type, and a layer (PSD) that overlies a portion of said doped area (NWell) and has a doping of an opposite second type of conductivity that is opposite from the first conductivity type of said doped area (NWell), and said layer (PSD) having a corner in cross-section, and the doping of said doped area (NWell) forming a junction beneath said layer (PSD) with the doping of said doped area (NWell) diluted in a vicinity below the corner of said layer (PSD). Other integrated circuits, substructures, devices, processes of manufacturing, and processes of testing are also disclosed.

5 Claims, 13 Drawing Sheets

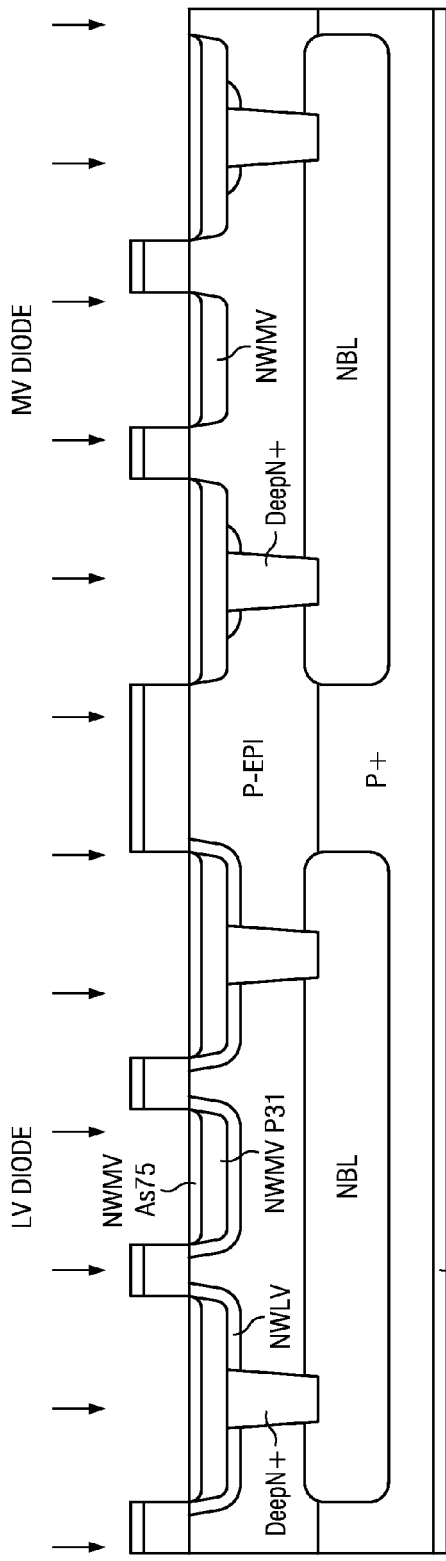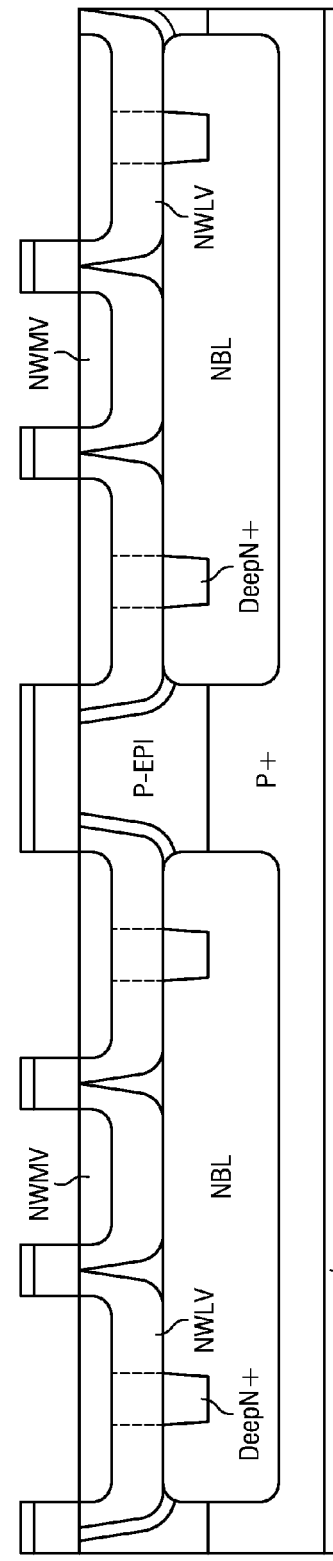

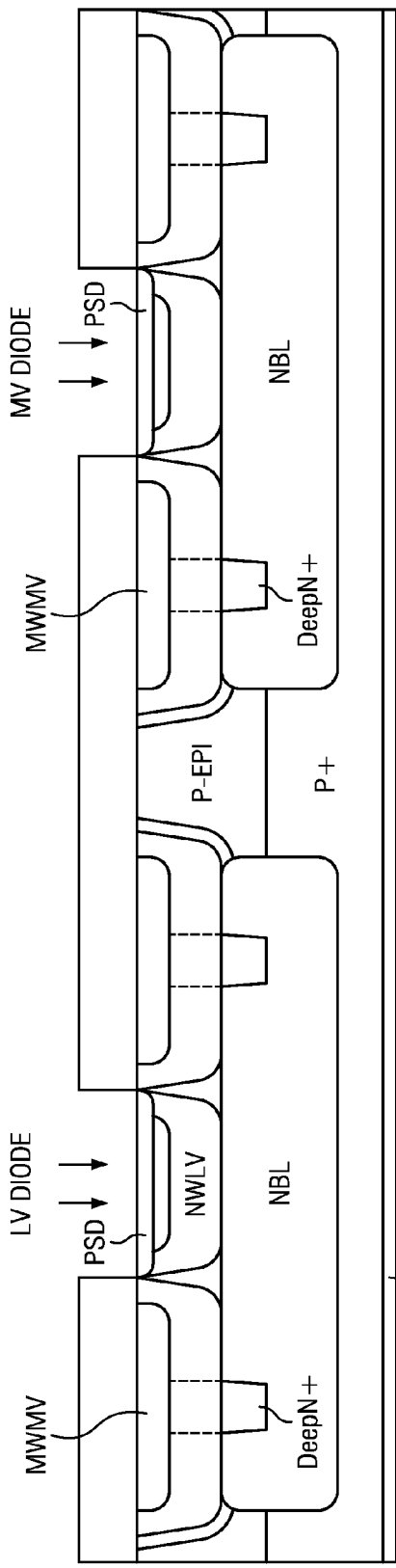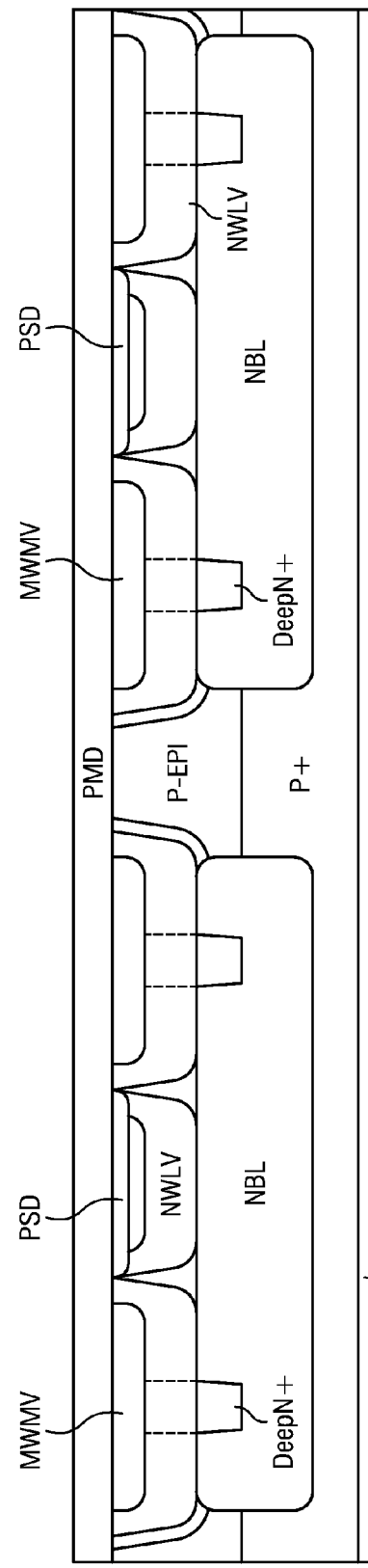

ESD DIODE WITH PSD PARTIALLY OVERLYING P-EPI CIRCUMFERENTIAL OF PSD

This application is related to provisional U.S. patent application "Diodes With a Dog Bone Junction Profile to Enhance ESD Performance, Integrated Circuits and Processes of Manufacture" Ser. No. 61/351,605, filed Jun. 4, 2010, for which priority is claimed under 35 U.S.C. 119(e) and all other applicable law, and which is incorporated herein by reference in its entirety.

STATEMENT REGARDING FEDERALLY SPONSORED RESEARCH OR DEVELOPMENT

Not applicable.

FIELD OF THE INVENTION

The field of the invention includes electronic integrated circuits and integrated circuit substructures, and processes of manufacturing integrated circuits and protecting and testing them. Among other integrated circuits, various integrated circuits such as diodes, electrostatic discharge (ESD) protective circuits, analog and mixed signal circuits, digital circuits, wireless circuits, and application specific integrated circuits (ASICs) can benefit from the embodiments.

BACKGROUND

Without limitation, the background is described in connection with diodes and integrated circuit structures for Electrostatic discharge (ESD) protection. ESD protection for integrated circuits is vital to protect them from degradation and damage due to contact with manufacturing machines, personnel, and users and/or with any objects that can convey static electricity into the integrated circuits. A sudden spark or surge of static electricity into an integrated circuit is called a strike event. Integrated circuits have diodes and transistors among other possible structures deposited and formed therein according to various processes.

A diode has a junction with junction corners or a silicon/oxide interface or an interface with a junction having carrier depletion in some other materials system. A diode conducts well in one direction of electric current flow and poorly or negligibly in an opposite direction. An electric field is the property by an electric force is provided to cause more or less current flow depending on the conducting ability of a semiconductor structure. Electric potential is that property of electricity represented by spatial contour lines (electric equipotential lines of equal voltage) wherein nearer closeness of the contour lines represents a higher intensity electric field. Electric current flows, if at all, in a direction perpendicular to the contour lines like water flows down a hill perpendicular to the contour lines of the hill, i.e. lines joining points of equal elevation.

In an ESD strike event, a conventional diode fails at the junction corner or silicon/oxide interface due to the larger or more acute curvature of electric equipotential lines, compressing the electric equipotential lines closer together and resulting in higher electric field and current flow in the regions.

FIG. 1 illustrates a microscopic cross-section of a conventional ESD diode structure. An NWELL defines PSD/NWELL junction breakdown voltage. NBL & DeepN minimize resistance in current path. (For the acronyms, see Glossary TABLE 1.)

ESD diodes should not conduct more than negligibly when the integrated circuit being protected is being powered with ordinary operating voltage. However, ESD diodes should conduct and not fail when much greater than ordinary operating voltage at same polarity is impressed on the integrated circuit, or when any voltage of opposite polarity is undesirably present. Or in substantial ESD strikes, indeed, ESD diodes should conduct as much current as possible to minimize the chance of the devices failing at such ESD strikes.

FIG. 2 depicts the equipotential lines at the 0.7th nanosecond of a standardized electrostatic discharge pulse called an IEC pulse. In FIG. 3, when an ESD diode is considered microscopically, the corresponding electric field is caused to be substantially increased at the junction corner due to the spatial curvature at the corner of the electric potential of FIG. 2. That curvature brings the potential lines there much nearer one another and causes a higher electric field in only one or more of such relatively small junction corner portions of the larger diode structure. Thus, the potential curvatures result in higher electric field at the edge/corner of a conventional junction.

In FIG. 4, the higher electric field also triggers more current flowing through the edge or corner of the junction (avalanche) than other parts of the diode. This very substantial non-uniformity of electric field inefficiently concentrates current flow in the diode, when it occurs, into a very small part of the diode structure, and thus poorly uses the diode structure for ESD purposes. In a reversed bias with high current operation in such a diode at an ESD strike, the enhanced electric field at a junction corner conducts more current (avalanche). In FIG. 5, the higher current heats the diode to high temperatures at such corner and causes junction failures at the corner. The premature failure degrades the ESD performance of IC devices. Thus, the higher electric field at the corner leads to higher current at the corners, which leads to higher temperatures there. An ESD diode can fail prematurely at the corner due to the high electric field itself or due to thermal runaway degrading the properties of the semiconductor material there and allowing yet more electric current to flow and thereby causes the diode to fail prematurely.

Accordingly, significant departures and alternatives in circuits, structures, and processes for addressing the above considerations and problems would be most desirable.

SUMMARY OF THE INVENTION

Generally, and in one form of the invention, an integrated circuit structure includes a semiconductor doped area having a first conductivity type, and a layer that overlies a portion of the doped area and has a doping of an opposite second type of conductivity that is opposite from the first conductivity type of the doped area, and the layer having a corner in cross-section, and the doping of the doped area forming a junction beneath the layer with the doping of the doped area diluted in a vicinity below the corner of the layer.

Generally, and in another form of the invention, an integrated circuit (IC) includes a substrate with a circuit to be protected; and an electro-static discharge (ESD) structure coupled, and integrated with the circuit to be protected, as a diode that back-biases by ordinary operating voltage polarity for the circuit, the ESD structure having a cap-shaped doping profile overlying an opposite-conductivity doped portion and operable upon an ESD strike to provide avalanche conduction primarily perpendicular to the plane of the substrate and utilizing and conserving the periphery of the cap-shaped doping profile, whereby to protect the IC.

Generally, a manufacturing process for making an integrated circuit involves a process including forming a first-conductivity-type region in an opposite-type substrate; and providing an approximately cap-shaped structure having such opposite-type overlying and at least partially laterally bounding the first-type region so that an impressed electric field where the structure overlies the first-type region is at least as great in magnitude as an impressed electric field where the structure laterally bounds the first-type region.

Generally, another manufacturing process for making an integrated circuit involves a process including providing an epitaxial layer, implanting a spatial arrangement of a first-conductivity-type dopant including a first-type well in the epitaxial layer, the epitaxial layer having original opposite-type doping; performing diffusion of the first-type dopant, implanting an opposite-type layer, and annealing.

Other integrated circuits, substructures, devices, processes of manufacturing, and processes of testing are also disclosed and claimed.

BRIEF DESCRIPTION OF THE DRAWINGS

FIGS. 20A and 20B are cross-sectional manufacturing process diagrams of a structural embodiment in successive stages of such manufacturing process embodiment.

FIGS. 21A and 21B are cross-sectional manufacturing process diagrams of a structural embodiment in subsequent successive stages of such manufacturing process embodiment, shown subsequent to the stages of FIGS. 20A and 20B and showing completion of the-shaped or dog bone shaped diode structure.

Corresponding numerals or designators in different Figures indicate corresponding parts except where the context indicates otherwise. A minor variation in capitalization or punctuation for the same thing does not necessarily indicate a different thing. A suffix .i or .j refers to any of several numerically suffixed elements having the same prefix.

DETAILED DESCRIPTION OF EMBODIMENTS

TABLE 1 provides a Glossary to help interpret the drawings.

TABLE 1

GLOSSARY

Em: Electric field V/cm.
ESD: Electro-static Discharge
DN: Deep n-type implant
IC: Integrated Circuit
IEC: International Electrotechnical Commission
"IEC 61000-4-2 pulses" One of the IEC ESD standard types of pulses
LPCVD: Low Pressure Chemical Vapor Deposition
NWLV: low voltage n-well (for low voltage diode)
NWMV: medium voltage n-well (for medium voltage diode)
drw: drawn layer
NBL: N-type buried layer
PMD: Pre-Metal Dielectric
PSD: P-type Source/Drain
P-EPI: P-type epitaxial layer
"351C., 394C., 440C." (Celsius temperatures)
"Signed Log" N-type is + plus log and P-type is minus (−) log.
Log doping concentration is on a per cm^3 basis.

A semiconductor doping profile at the junction corner is formed herein in such a way that the largest potential curvature does not create the largest electric field. The resulting junction is called a dog bone shape profile or cap-shaped profile herein.

Embodiments of process and structure provide a dog bone junction profile which eliminates the high electric field in those regions. The diode(s) therefore does not fail prematurely and achieves better ESD performance.

The dog bone junction profile is more efficient to eliminate the high electric field region and avoid premature junction breakdown than a prior technique called field plating. And in some embodiments, the junction herein by its nature cannot have field plating or no layer (such as poly) to generate an effective field plating effect. In this way, embodiments that could have field plating are made superior, and embodiments that cannot have field plating are endowed with excellent ESD performance notwithstanding.

For a diode at a reversed bias with high current operation such as an ESD strike, the electric field is increased at the junction corner due to the potential curvature and conducts more current (avalanche) which leads to lateral diode conduction excessively and causes junction failures at corner. However, surge protection amperage of a lateral diode may be limited to values less than desired. A conventional vertical diode may have the junction capacitance likely to be too high to be acceptable for some applications.

The resulting embodiments of integrated circuits having diodes and/or ESD as taught herein are useful in wireless, mass storage, analog, mixed signal and logic circuits, among others.

Figure 6:
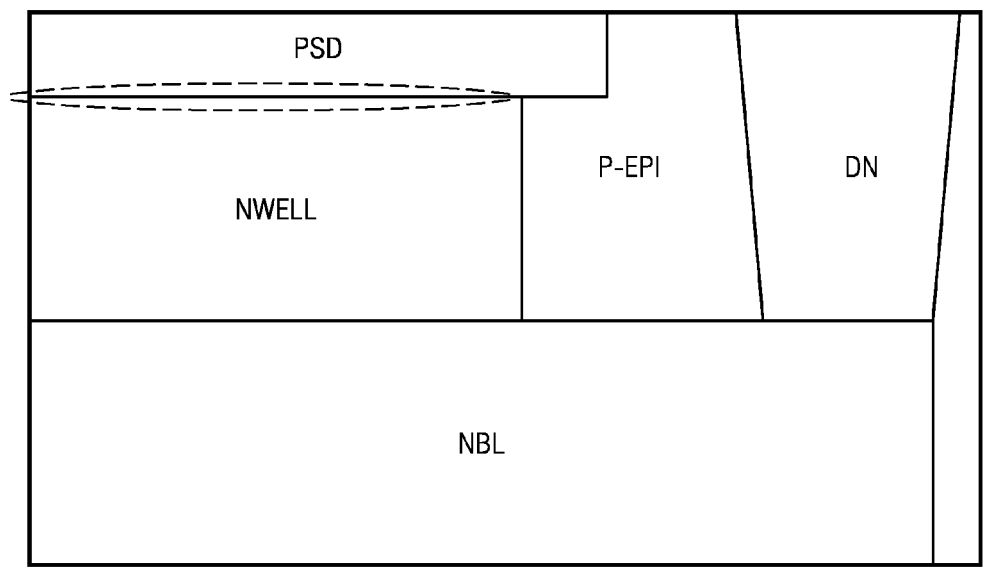
FIG. 6 is a cross-sectional view of one structural embodiment having cap-shaped arrangement.

In FIG. 6, a vertical diode embodiment has a de-activated junction corner (by providing a P-EPI region as illustrated next to the PSD corner). De-activating the junction corner valuably increases the local resistivity there and decreases the amount of current there that might contribute to failure during an ESD strike. However, the junction corner does not contribute to current conduction and increases the junction capacitance, which may be important considerations in some integrated circuits.

Figure 7:
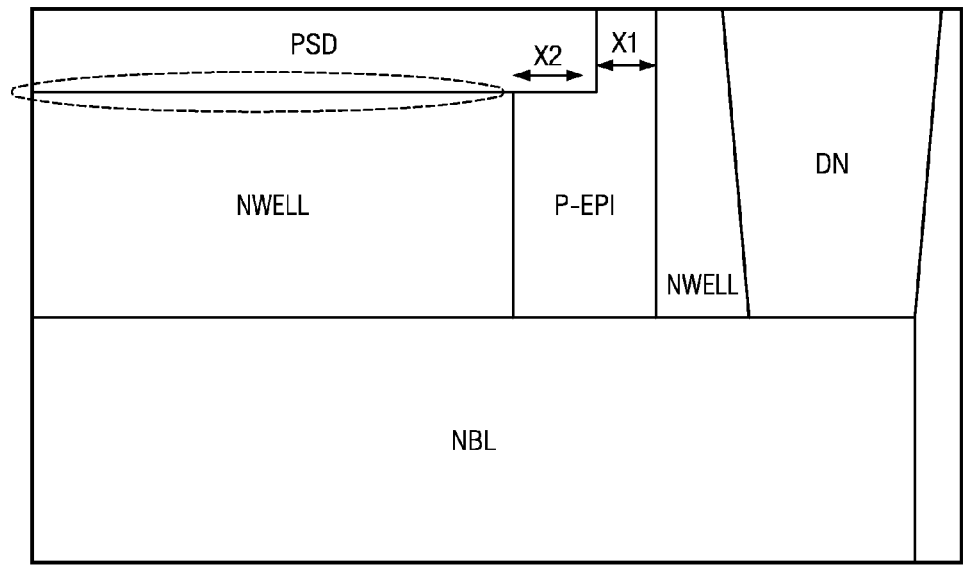
FIG. 7 is a cross-sectional view of another structural embodiment with a cap-shaped arrangement and showing some dimensions.
Figure 8:
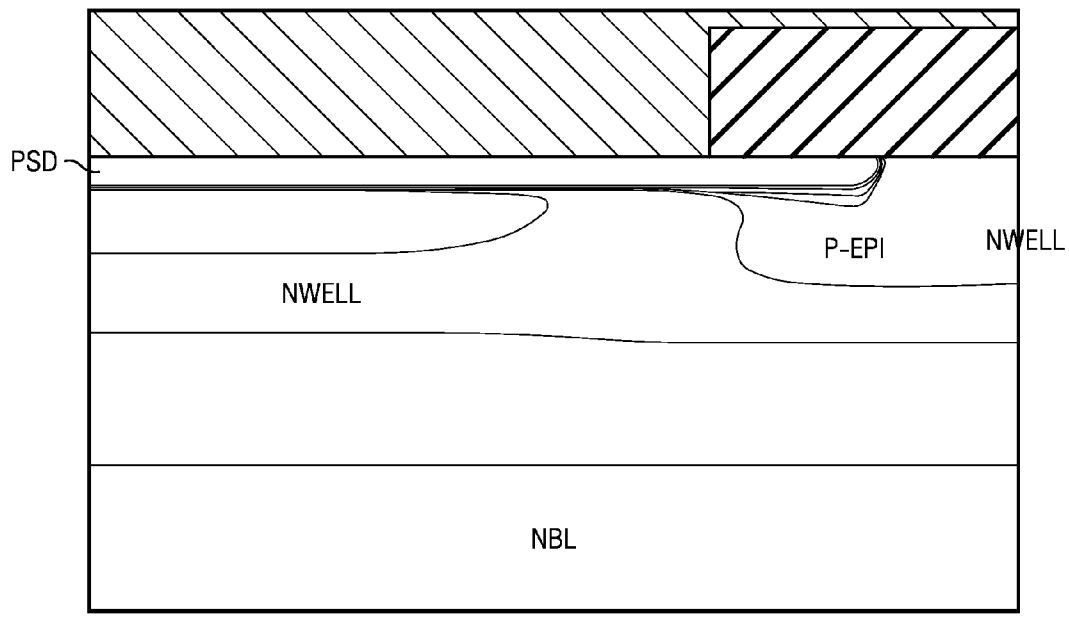
FIG. 8 is a doping profile diagram of doping density spatially distributed over a cross-section of a structural embodiment having a cap-shaped or dog bone-shaped doping profile, for comparison with FIG. 1.

FIGS. 7 and 8 show a cross-section and a doping profile respectively for an embodiment of a diode with a cap-shaped or dog bone junction profile to enhance ESD performance. This vertical diode has the cap-shaped or dog bone shaped junction profile and presents acceptable, minimal or reduced junction capacitance. The PSD overlies a first N-well bounded by an epitaxial region of width X. Dimensions X1 and X2 are called apportionment dimensions herein for the epitaxial material width X, where X=X1+X2. Epi apportionment dimension X1 is the width of epi between the PSD and a second N-well that lies laterally beyond the epi in FIG. 7. Epi apportionment dimension X2 is the balance of the width X of the epitaxial material along which the PSD encroaches over the epi. Reducing dimension X1 decreases capacitance. The optimized X1 has a minimum (or at least reduced) capacitance compared to X1 at full width X, without significantly sacrificing ESD performance of a vertical diode. Optimizing the junction profile leads herein to the dog bone junction profile.

Figure 1:
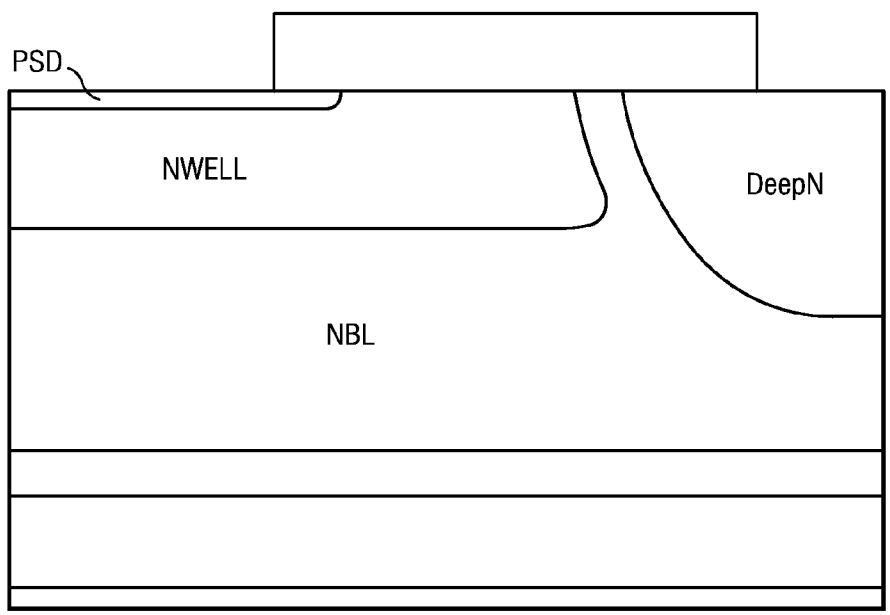
FIG. 1 is a doping profile diagram of doping density spatially distributed over a microscopic cross-section of a conventional ESD diode structure.
Figure 2:
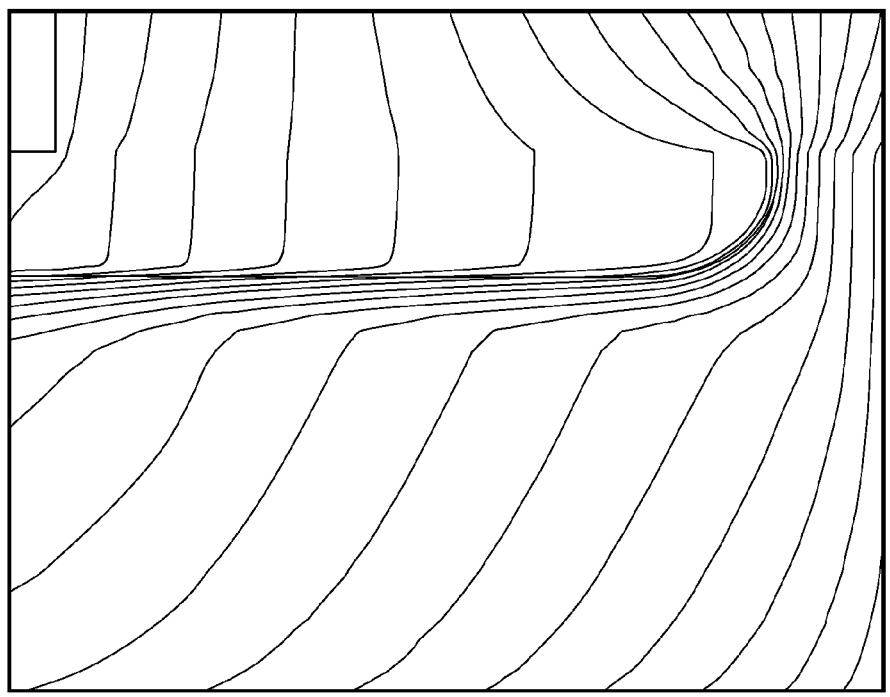
FIG. 2 is a diagram of undesirably constricted equipotential lines at a corner of a PSD layer of FIG. 1, using a considerably magnified scale relative to the scale of FIG. 1.
Figure 3:
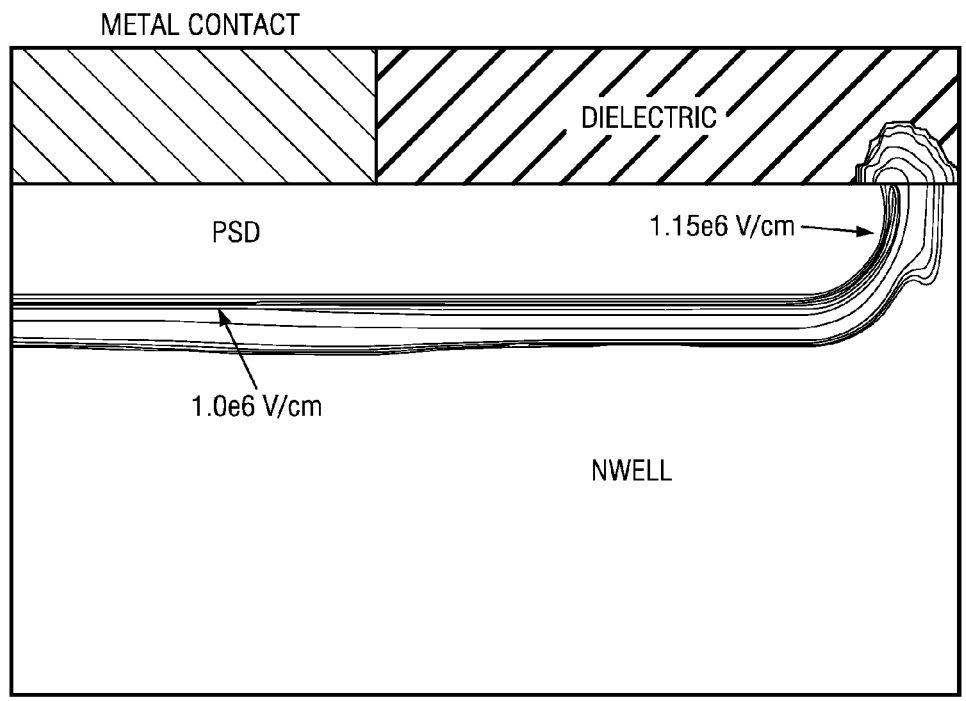
FIG. 3 is a cross-section like FIG. 1 but considerably magnified to show the corner of the PSD layer and undesirably higher electric field strength at the corner compared to underneath the layer.
Figure 9:
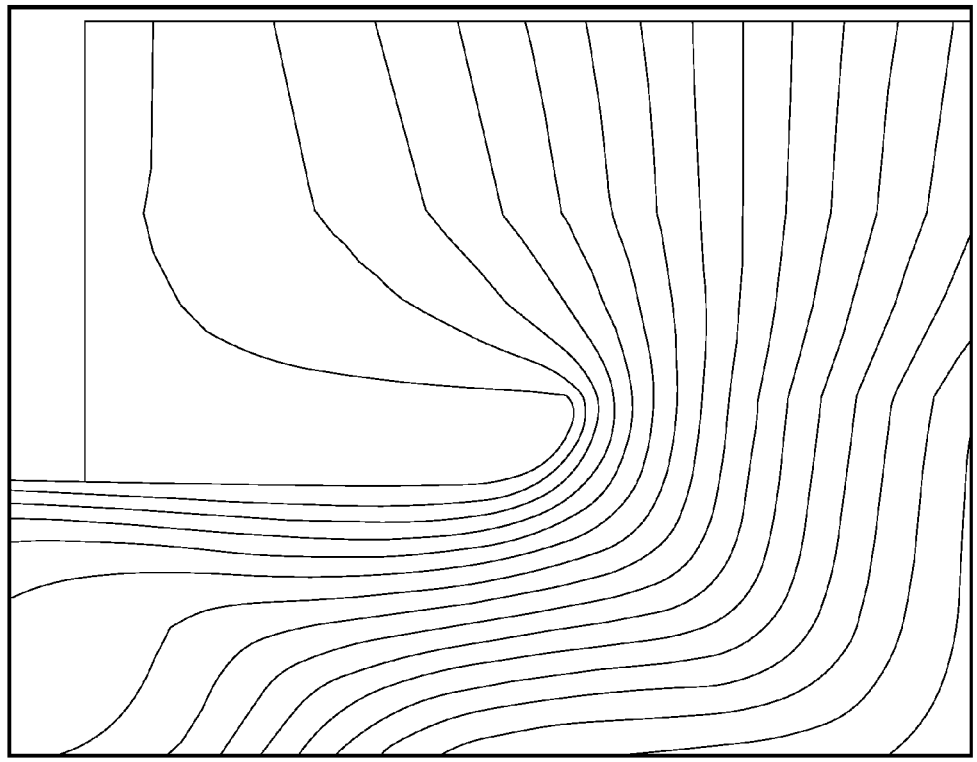
FIG. 9 is a diagram of desirably less-constricted equipotential lines at a corner of a PSD layer of FIG. 8, using a considerably magnified scale relative to the scale of FIG. 8, for comparison with FIG. 2.
Figure 10:
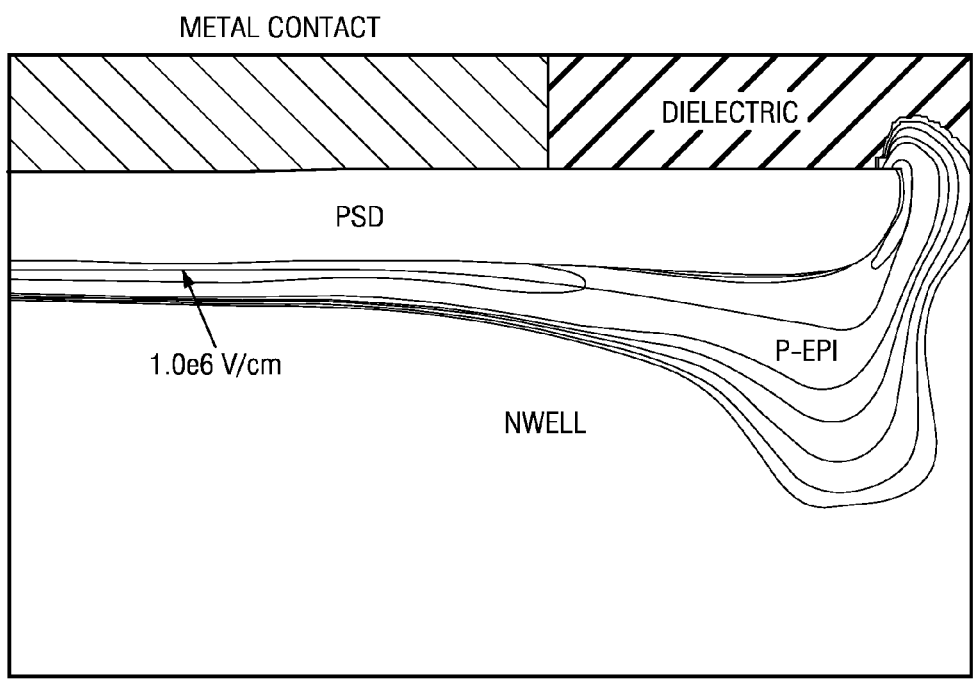
FIG. 10 is a cross-section corresponding to FIG. 8 but considerably magnified to show the corner of the PSD layer and desirably lower electric field strength at the corner compared to underneath the layer, for comparison with FIG. 3.

In FIG. 9, the dog bone junction profile of FIGS. 7-8 reduces the electric field at the junction corner. Comparing FIG. 9 with FIG. 2, notice that the FIG. 9 cross-section has its equipotential lines less densely packed than in FIG. 2, indicating that the electric field is reduced in FIG. 9. In FIG. 10, peak electric field occurs or takes place, and is situated, beneath the junction in this vertical diode. Being beneath the junction provides more thermal conductivity to conduct heat away and protect the diode from thermal runaway. Both peak electric field and peak current occur and take place at the bottom of the junction. In an example, the peak electric field strength is 1.0e6 V/cm in FIG. 10 versus 1.15e6 V/cm for a conventional diode of FIG. 3 at the IEC test peak current. Bear in mind the electric field strength is high—a million volts per centimeter—but dramatically better distributed. In this way, the peak electric field strength is much more uniform over the spatial extent and material of the ESD diode, enhancing its ESD performance and reducing the chances of failure. The dog bone or cap-shaped junction profile has lower peak electric field, and the junction capacitance is about the same, i.e. not increased.

Figure 4:
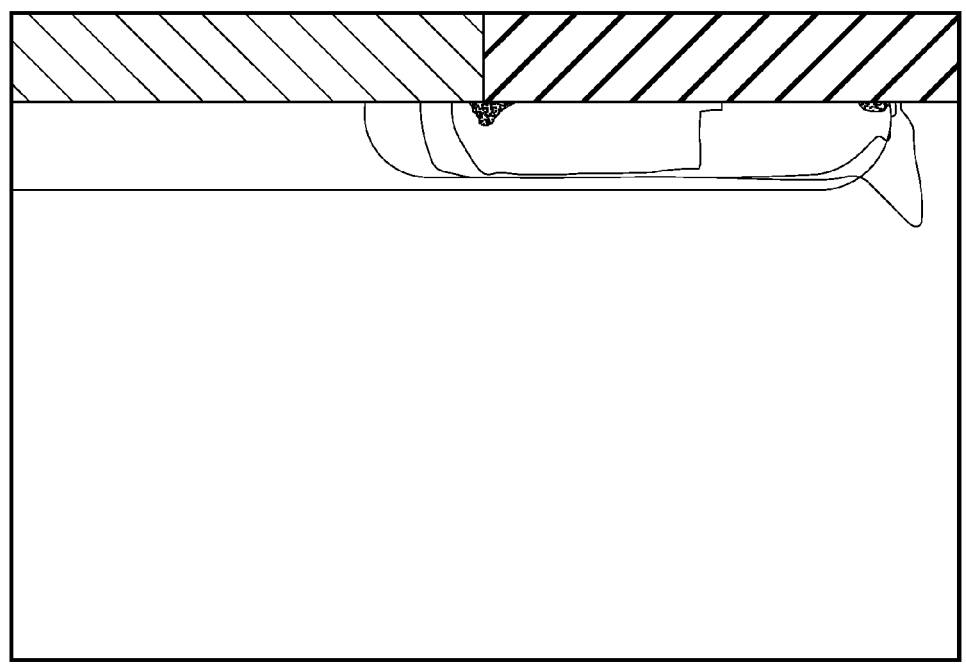
FIG. 4 is a diagram of current density spatially distributed over the cross-section of the structure, moderately magnified in scale relative to FIG. 1.
Figure 5:
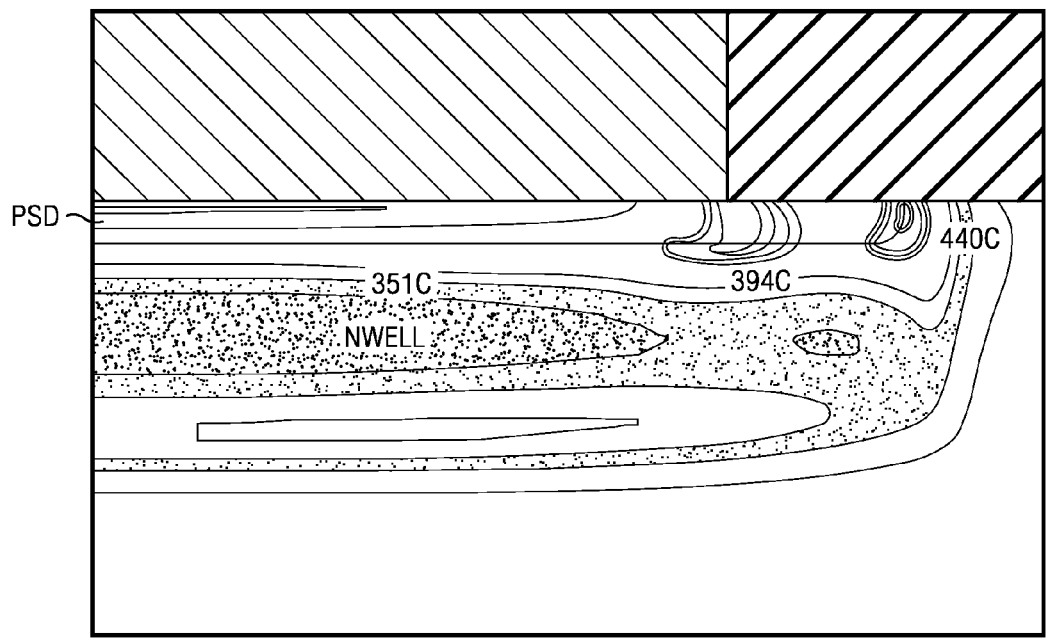
FIG. 5 is a diagram of temperature distribution spatially distributed over the cross-section of the structure, showing a hotspot at the corner of the PSD layer, and somewhat magnified relative to FIG. 1 but less magnified than in FIG. 4.
Figure 11:
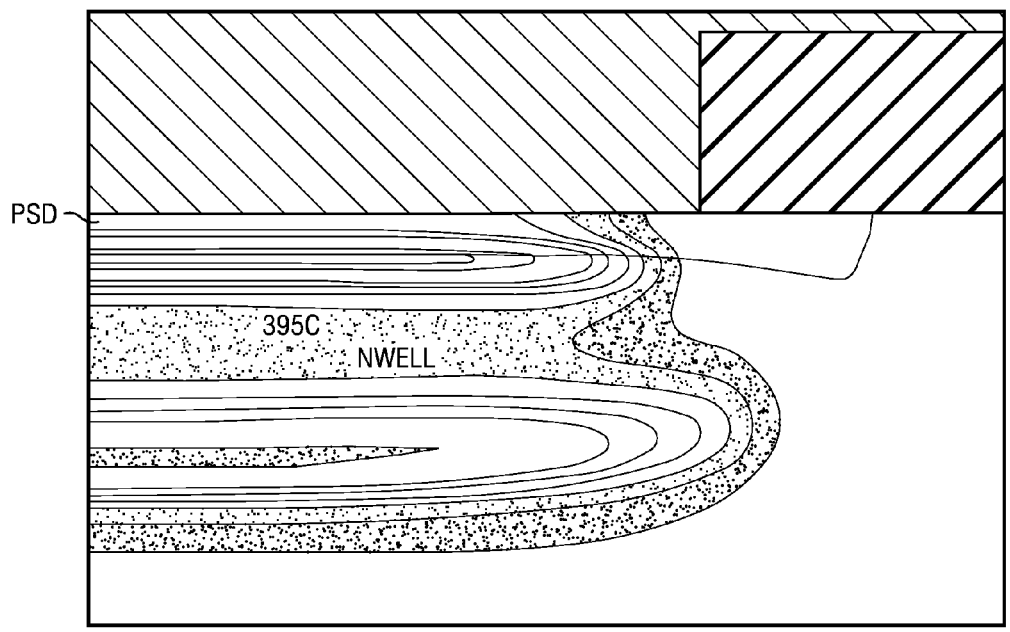
FIG. 11 is a diagram of temperature distribution spatially distributed over the cross-section of the structure of FIG. 8, showing a desirably cooler area at the corner of the PSD layer, for comparison with FIG. 5.

FIG. 11 shows a temperature distribution over the cross-section of the ESD diode embodiment of FIGS. 7-10. Since both peak electric field and peak current occur and take place at the bottom of the junction in the strike event, peak junction temperature occurs there as well. Notice the substantially horizontal disposition of hottest junction temperature, indicating avalanche current conduction vertically or perpendicular to the substrate plane. Peak junction temperature in FIG. 11 is 395 C (degrees Celsius) for the FIG. 8 dog bone profile, versus a much higher and riskier 440C for a conventional junction of FIG. 5 at the 0.7th ns of an IEC pulse. Thus, the dog bone junction profile (curved line hooking upward at right in FIGS. 8-11) has lower junction temperature than that of a lateral diode of FIG. 5 at the first peak of an IEC 61000-4-2 pulse. See the IEC web site at http://www.iec.ch/ for that standard pulse, at http://webstore.iec.ch/webstore/websto-re.nsf/standards+ed/IEC%2061000-4-2%20Ed.%202.0?OpenDocument. Surge protection at least up to 27 A (amperes) can be obtained. Regarding intrinsic junction breakdown, the dog bone junction does not break down prematurely either due to electric field or thermal runaway. Thus, upon an ESD strike, the avalanche conduction is primarily perpendicular to the plane of the substrate (unlike FIGS. 4 and 5) and utilizes and conserves the periphery of the cap-shaped doping profile, protecting the IC.

Figure 12:
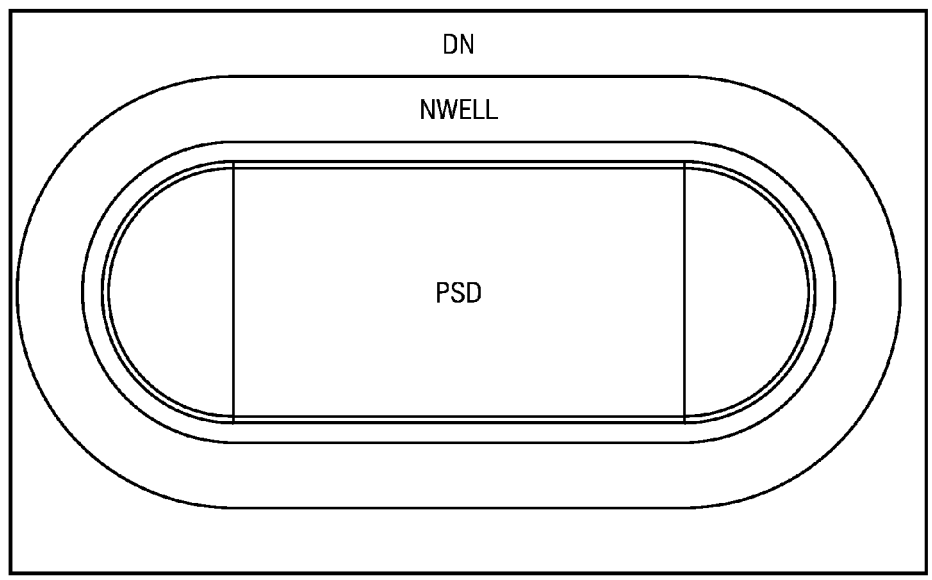
FIG. 12 is a broadside or plan microscopic view of a structural layout of an ESD diode embodiment having a ring or oval-shaped structure, as seen from above the substrate at a considerably de-magnified scale relative to the scales of the embodiments of FIGS. 6-11 which are cross-sectional to the substrate.

In FIG. 12, a layout of an ESD diode embodiment has a ring or oval-shaped structure as seen broadside or in plan view to the ESD diode (viewing direction is toward the broad surface of the IC substrate). The gap is defined by the optimized electric field and capacitance. Outer material is Deep N+ (i.e., DN) and NWMV. The oval is NWLV. The inner material bounded by the oval is PSD Inner NWLV of the oval defines the diode junction, and the outer NWLV reduces the junction capacitance. All are "drw."

The layout of FIG. 12 creates or has a dog-bone shape junction profile in FIGS. 7-11. The dog-bone junction profile avoids premature junction breakdown at a junction corner or edge, and the junction capacitance is minimized.

Figure 13:
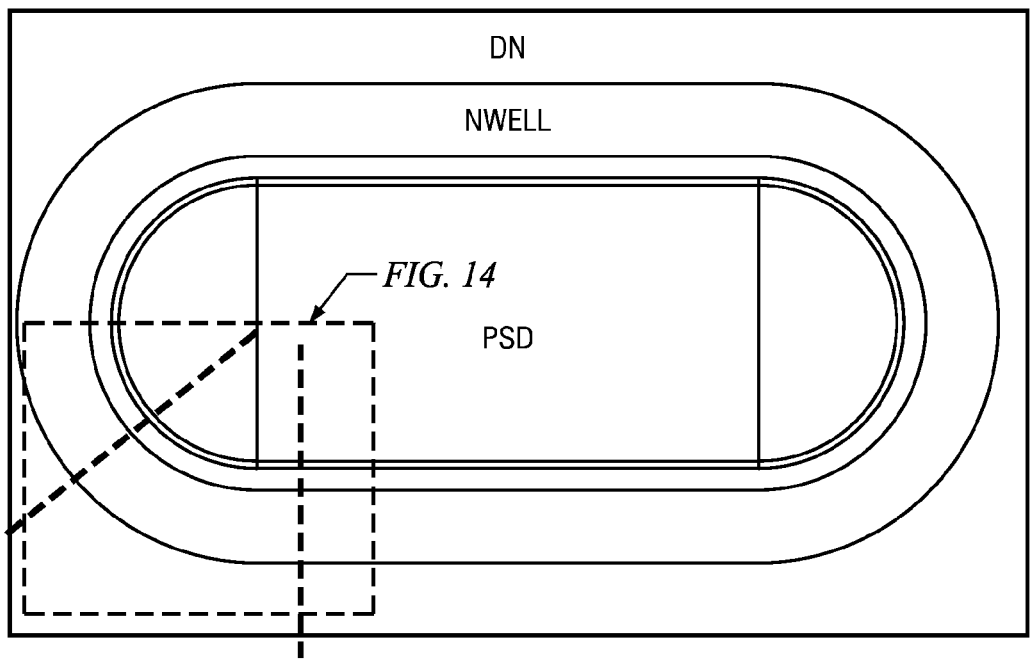
FIG. 13 is a broadside view as in FIG. 12 and showing examples of section lines for FIGS. 6-11.
Figure 14:
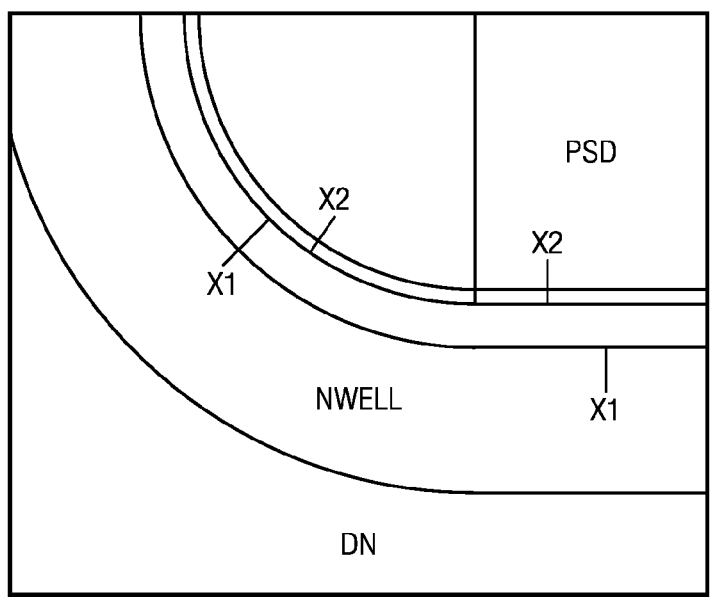
FIG. 14 is a somewhat enlarged view of FIG. 13 showing layout dimensions and structures that show how the layout of FIG. 12 physically relates to dimensions and structures in FIGS. 7 and 15.

FIGS. 13-14 are layout diagrams that show how the layout of FIG. 12 physically relates to dimensions and structures in FIG. 7. The relative scale of an oval layout portion of FIG. 13 is magnified in FIG. 14 to locate the cross-section of FIGS. 15 and 7. The cross-section of a curved portion of the oval of FIG. 12 is the same as a cross-section of a straight line portion of that oval, as indicated by dotted sectioning lines in FIG. 13.

Figure 15:
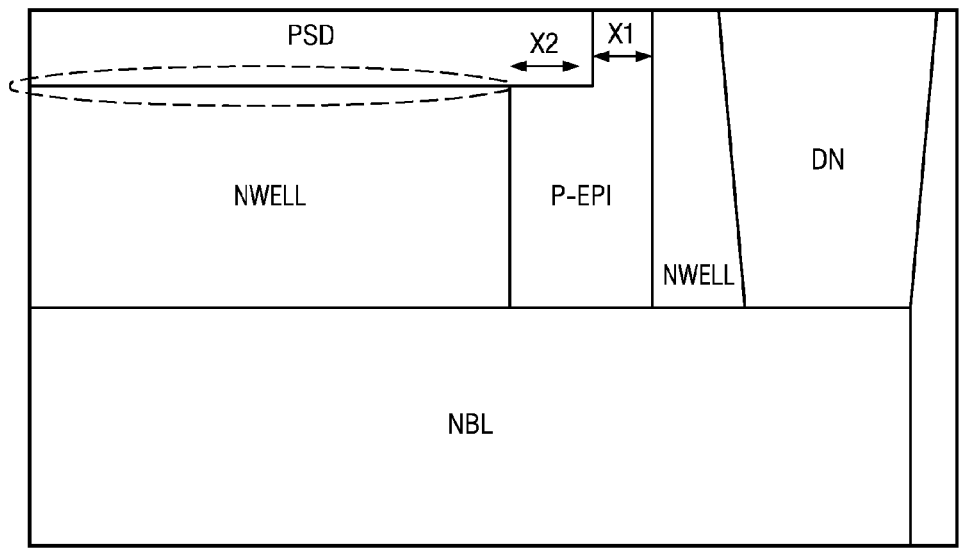
FIG. 15 is a diagrammatic cross-section like FIG. 7 and is positioned near FIG. 14 to help locate corresponding structures and dimensions in these figures.
Figure 16:
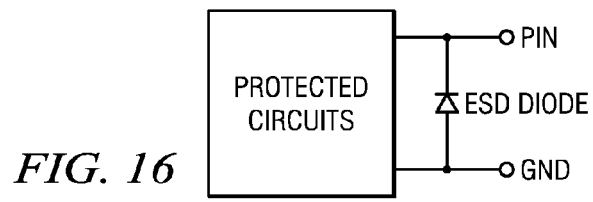
FIG. 16 is a partially schematic, partially block diagram of an integrated circuit embodiment including protected circuits and an ESD diode of FIG. 17 integrated therewith.
Figure 17:
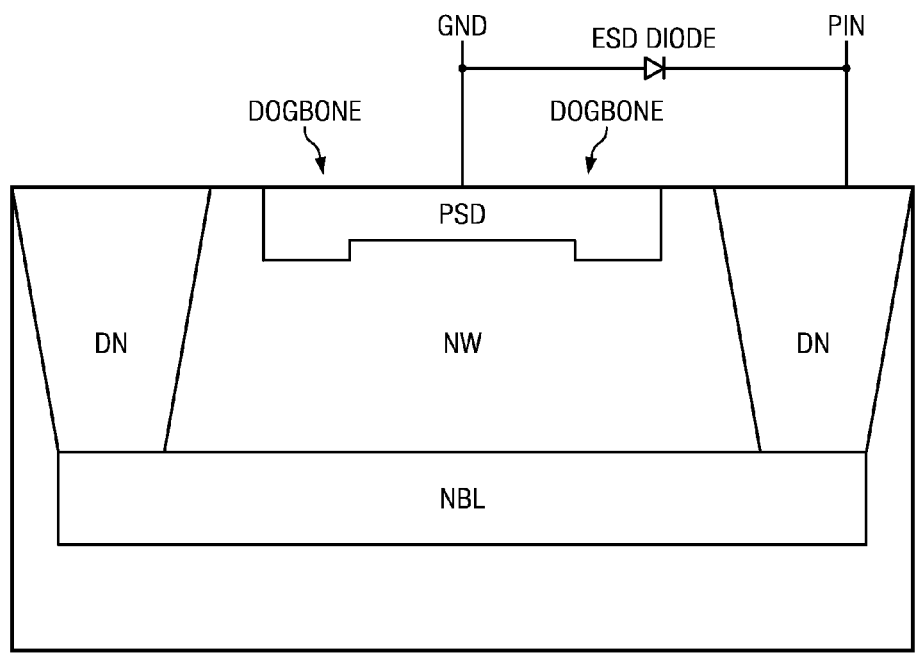
FIG. 17 is a partially cross-sectional, partially schematic diagram showing an ESD structural embodiment with a cap shaped or dog bone shaped doping structure in cross-section operating as a back-biased diode to PSD ground to protect circuits in FIG. 16, the ESD embodiment equivalent circuit shown schematically superimposed.

FIGS. 16 and 17 show one schematic/block diagram of this ESD structure in its context coupled and integrated with an integrated circuit IC as a back-biased diode to ground that protects the circuits of the IC. In FIG. 16, the ESD diode is back-biased by ordinary operating voltage for the IC, effectively presenting a low capacitance open circuit. An ESD strike causes avalanche conduction in the ESD diode, which protects the IC. In FIG. 17, the PSD is connected to ground GND, and DN is connected to a pin. A dogbone junction of FIGS. 7-15 is present and generally indicated in FIG. 17. A schematic symbol of a diode is provided in FIG. 17 to indicate the ESD diode properties conferred by the physical structures in the cross-section of FIG. 17 itself. A pin-to-pin ESD strike in FIGS. 16-17 is protected by the effective combination of a first ESD diode from pin to ground and a second ESD diode made like the first ESD diode but considered in reverse sense from ground to another pin like FIG. 18 and further with grounded connection of the series diodes, thereby forming an applicable pair of ESD diodes for pin to pin protection in FIG. 17.

Note that the word "pin" herein refers to either a package pin of a packaged IC or to a bond pad on an IC wafer or die. The word "ground" herein refers to a pin (which can be a bond pad as just noted) that is or connects to a circuit common of the integrated circuit, such as for completing a power connection to the integrated circuit. Either supply polarity VSS or VDD may be regarded as a common or "ground" for ESD purposes herein, regardless of designation for functional circuit purposes. The word "pin" when used in contrast to the word "ground" means that such "pin" is connected to some circuit point or circuit portion of the integrated circuit other than directly to the circuit common of the integrated circuit.

Also note that the "cap" shape may be arranged by or relative to materials of opposite conductivity types in a peripherally convex cap-shape, or equivalently otherwise to suitably effectuate one or more of the advantages or benefits described herein. In some of the embodiments, a p-n junction is formed between two regions one of which is generally thinner and may be less extensive than the other. That thinner region is peripherally structured to spatially terminate the junction in a manner that spreads equipotential lines at a periphery, corner, or edge so that the maximum magnitude of an electric field such as under reverse-bias is confined to the junction portion inward from the periphery. That inward junction portion is planar or mostly-planar in some of the embodiments as shown, and may have a non-planar shape in some other embodiments. The cap-shape may vary in cross-sectional dimensions along the periphery of the doping profile or be established entirely or only partially therealong. Accordingly, the word "cap" is understood to include such cap-like, dog bone-like, downwardly flanged, peripherally indenting, or other like structures. "Downward" or "below" can refer a direction from the thinner region toward the other region against which the junction is made. That direction may also be oriented from a more recently-formed doping profile, region or structure toward or into a previously-formed profile, region or structure. These definitions are provided by way of approximate guidance to aid understanding and interpretation without rigidly confining them.

Figure 18:
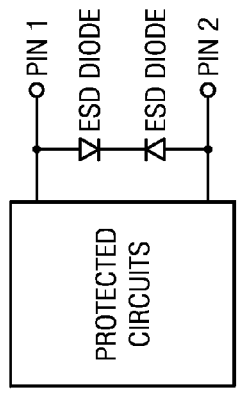
FIG. 18 is a partially schematic, partially block diagram of an integrated circuit embodiment including protected circuits and back-to-back ESD diodes of FIG. 19 integrated therewith.
Figure 19:
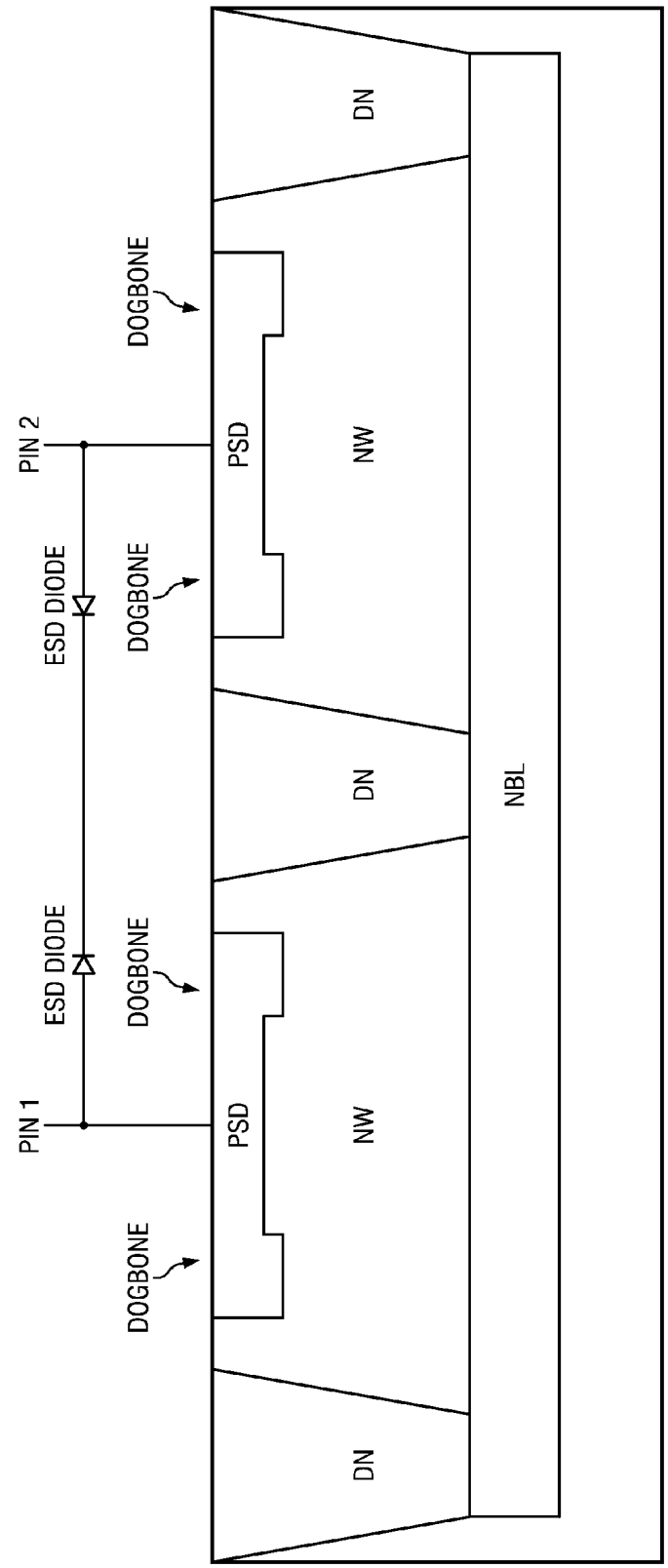
FIG. 19 is a partially cross-sectional, partially schematic diagram showing another ESD structural embodiment with a pair of cap-shaped or dog bone shaped doping structures in cross-section and operating as back-to-back diodes between PSD pins to protect circuits in FIG. 16, such ESD embodiment equivalent circuit shown schematically superimposed.

FIGS. 18 and 19 show multiple implementations of the dogbone ESD ovals (each oval as in FIG. 12) provided for pin-to-pin protection with ungrounded connection of the series ESD diodes, on one chip (or alternatively, further such pin-to-pin diode-pair protection may be additional to pin-to-ground diodes in FIGS. 16 and 17). FIGS. 18 and 19 illustrate the ESD diodes reversely connected to each other in series and in opposite sense (cathode to cathode). One of the two diodes is forward-biased and the other diode is back-biased by ordinary operating voltage for the IC, effectively presenting a low capacitance open circuit. An ESD strike having the same polarity as IC operating voltage causes ordinary forward conduction in the first diode and avalanche back-bias overvoltage conduction in the other ESD diode, which protects the IC. An ESD strike having an opposite polarity to that of IC operating voltage causes ordinary forward conduction in the other ESD diode and avalanche conduction in the first-mentioned ESD diode, which protects the IC on reverse-polarity strikes. In FIG. 19, each PSD is connected to a respective Pin1 or Pin2. A dogbone junction of FIGS. 7-15 is associated with each PSD as generally indicated in FIG. 19. The schematic diagram of back-to-back diodes is provided in FIG. 19 to indicate the ESD diode circuit properties conferred by the physical structures in the cross-section of FIG. 19 itself.

Note that in an IC with numerous pins, the ESD diode, or pairs of ESD diodes, are suitably provided for any one, some, or all of the pins for ESD protection to the extent desired. Parallel ESD diodes and series-parallel arrangements of the ESD diodes may be provided in some embodiments.

FIGS. 20A, 20B, 21A, 21B show a process embodiment flow in detail for establishing an ESD dog bone or cap-shaped junction profile or structure. The process steps are illustrated by process flow cross sections of the integrated circuit semiconductor structure in formation by FIGS. 20A-21B. Note in FIGS. 20A-21B that low voltage LV and medium voltage MV ESD diodes are shown in fabrication, such as for an integrated circuit that has different operating voltages on given pins to be protected. Note further in FIGS. 18 and 19 that the reverse-connected diodes between two given pins can have equal or different reverse breakdown voltage values in various embodiments for purposes of FIGS. 18 and 19 in this or other applications.

In FIG. 20A, the process embodiment flow commences at a point in a more extensive process that has already patterned and implanted N-type buried layers by NBL Implant Sb 5e15 60 kev, into a P+ Substrate, and then overlain it with a P-epitaxial layer by P-EPI Deposition (HCL 0.15 um etch, deposit p-epi 2.9 um, 7 ohm-cm epi), followed by steps including NW LV Implant (Phos 1.4e14 150 kev), and then N+ (POCL3) Deposition of Deep N+. Proceeding as illustrated in FIG. 20A, Well Pad Oxidation is followed by NW MV Implant (phosphorus P31 dose 8.5e12 at 150 kev, then arsenic As75 dose 1.0e12 at 135 kev). In FIG. 20B the process performs N+ Diffusion (1150 C for 275 minutes). The N+ diffusion is believed to dilute the N-well and thereby prepare the way for the dog bone junction profile formation coming next.

In FIG. 21A, processing then performs Nitride Strip, Pad Oxidation (350 A), PSD Pattern and PSD Implant. For an example of the PSD Implant, the dopant can be boron B11, doping concentration 3e15 cm-2, implant energy 20 kev.

In FIG. 21B, processing continues with PSD Anneal established at a suitable temperature and duration (e.g., 870 C, 30 minutes, nitrogen N2) for the particular process to produce the PSD with the remarkable dog bone distribution or cap-shaped junction profile for which the way was prepared as described hereinabove. Then PMD is deposited.

FIG. 7 shows a magnified view of the cross-section of FIG. 21, and in FIG. 21 the original extensive P-epitaxial layer is almost, and even entirely in some embodiments, replaced by other structures such as N-wells and PSD in the area of the dog bone, so that the dimensions X1 and X2 are established. Factors or parameters to create a dog bone or cap-shaped doping profile region involve the NWELL blocking ring and the size dimensions X1 and X2 in the plots. NWELL and PSD implant and diffusion are a relatively weak factor for dog bone creation meaning that the process is robust for this purpose, and dog bone creation is determined by the junction breakdown voltage and dynamic resistance. After the implant and diffusion are determined, and with the knowledge of PSD to NWELL mask alignment capability, size dimensions X1 and X2 are then established directly as discussed hereinbelow, or otherwise by iterations. The window of their permissible values and variability is moderately large. Accordingly, device performance stability is suitably also established along with optimization of ESD performance, diode capacitance, and other ESD diode parameters.

Example values that were obtained in a 0.7 micron process technology (described hereinabove) when the dog bone was satisfactory are given as follows:

Epi apportionment dimensions X1 and X2:
X1=1000 nm, X2=2000 nm
PSD depth d: d=400 nm.
Junction breakdown voltage Vb=7.3V and 15.5V, respectively, for LV and MV diodes.

Dynamic resistance Rd depends on the total junction size and a typical value is ~0.5 ohms for IEC 61000-4-2 level 4 applications.

Also, dimensional ratios can be useful for describing embodiments. Example ratios in 0.7 micron technology are
X1/X2=0.5 (ratio of p-epi apportionment)
(X1+X2)/d=7.5 (ratio of p-epi width divided by PSD depth)
D/d=1.3 (ratio of dog bone depth expansion D divided by PSD depth d)

Scaling down by about a factor of 20 from 0.7 micron technology to a 32 nm CMOS technology, X1 can be about 50 nm and X2 about 100 nm. Over a wide scale of different process technologies, each of X1 and X2 are likely to lie in a 1:1000 range of 10 nm to 10 um.

Various particular embodiments are likely to lie in ranges of values for at least marginally-acceptable improvement in ESD performance as taught herein.

A range for ratio of X1 divided by X2 is:
X1/X2 range 0.1 to 10 inclusive.
A range for ratio of p-epi width (or diluted N-well width portion) divided by PSD depth is
(X1+X2)/d range 2 to 20 inclusive.
A range D/d representing dog bone depth expansion ratio of dog bone depth D to PSD depth d:
D/d range 1.1 to 5 inclusive.

Thus, a p-n junction of varying depth results from the process, and an expansion ratio Did of deepest junction depth exterior to said layer divided by depth of said layer lies in a range 1.1 to 5 inclusive. The dog bone depth expansion ratio Did is 1.0 when no dog bone structure is present.)

Figure 24:
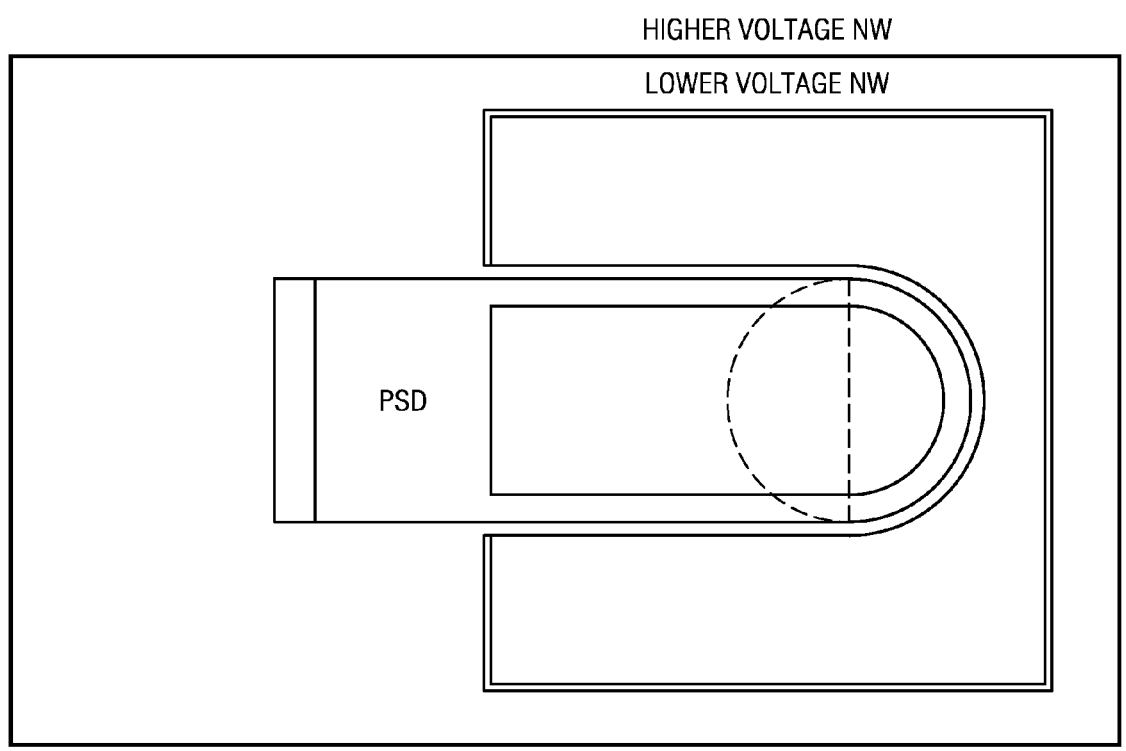
FIG. 24 is a broadside microscopic view of a structural layout of an alternative structural diode embodiment having an arc-shaped structure, as seen broadside to the substrate at a scale approximately like broadside FIG. 12 scale but considerably de-magnified in scale relative to the scales of the embodiments of FIGS. 6-11 which are cross-sectional to the substrate.

The oval ring in FIG. 12 in some embodiments is replaced by any of the following: 1) circle, 2) ellipse, 3) rectangle, 4) hourglass shape "8", 5) any closed shape, 6) open ring shape (U), see also FIG. 24. Rounded corners are helpful to situate in places where a back-biased ESD diode junction is subject to spatial equipotential line compression that could result in high electric field intensity in an ESD strike.

Further numerous steps, unrelated to the ESD diode fabrication herein, deposit one or more dielectric layers along with electrodes and functional integrated circuit layers according to any applicable process now known or to be established to create various types of integrated circuits and microelectronic structures.

Contact patterning and dry etch are performed, exposing NWMV and PSD. Then, contact deposition (not shown) of contacts for both the NWMV and the PSD is performed. In this way, the illustrated semiconductor structure is ultimately coupled to metal interconnect above, or to other interconnecting material by means of vertically-disposed conductive material called contact. The contact substance, for example, is a single or heterogeneous multiple layer of any suitable metallic or other contact material(s), e.g., titanium and/or alloy thereof or otherwise. The contact deposition process is by metal deposition(s) after PMD of FIG. 21B is patterned. A first contact is deposited 1 um inside the PSD (Anode), for example. Another contact is also deposited on an NWMV area. A second contact patterning and dry etch electrically separate the conducting material joining the contacts. That joining material results from the contact deposition just-previous. The dry etch divides the conducting material and thereby establishes separate electrical paths to the NWMV and PSD. Subsequent steps establish metallization. Assembly and test of the IC with or without packaging of any suitable materials and construction then complete an IC manufacture process.

The reader can compare the FIG. 12 layout with the FIG. 21 cross-section to see a section across the oval of FIG. 12 for the embodiment of FIG. 21. The area above the corner of the junction in FIG. 3 and above the dog bone in FIG. 10 is the dielectric. The black region adjacent to the dielectric is a metal and contact filled region over the PSD (anode).

Figure 22:
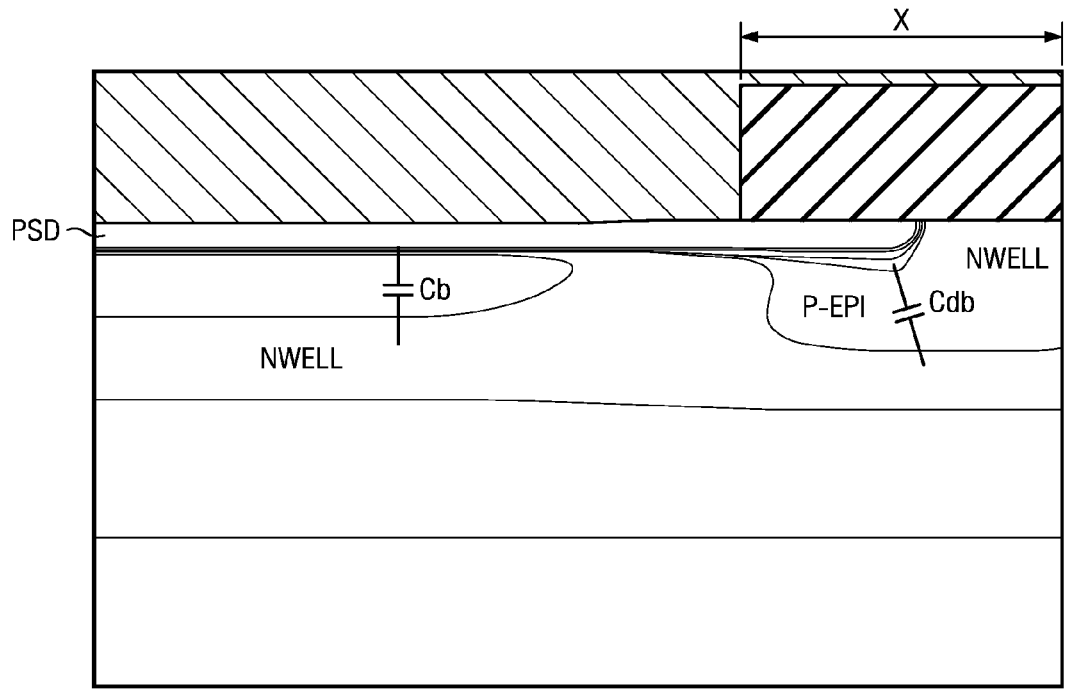
FIG. 22 is a schematic diagram of equivalent capacitances superimposed on the cross-section for the embodiment of FIG. 8.
Figure 23:
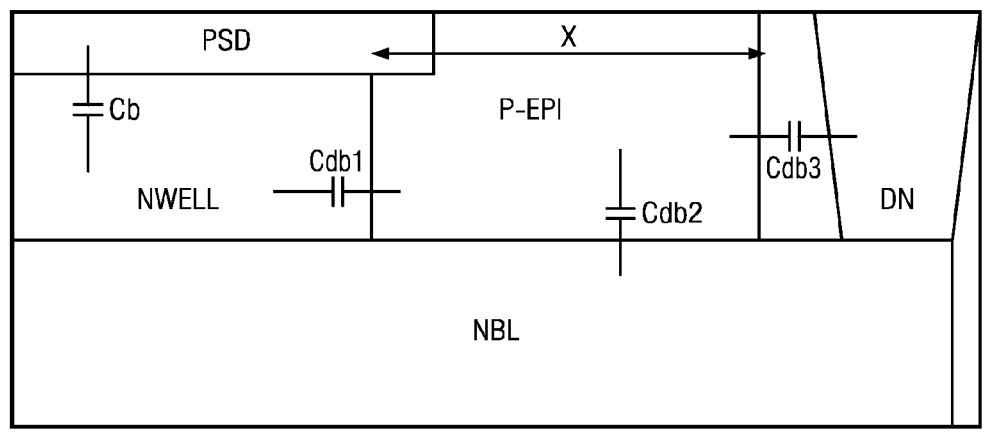
FIG. 23 is a schematic diagram of more detailed equivalent capacitances superimposed on the cross-section for the embodiment of FIG. 7.

In FIGS. 22-23, the subject of the ESD diode capacitance is illustrated by a network of capacitances for an equivalent circuit superimposed on the cross section of FIG. 8 to produce FIG. 22 and superimposed on the cross section of FIG. 15 to produce FIG. 23.

In an example dog bone structure herein, from a cross-section point of view, the total capacitance Ct is given as a sum:

$$Ct=Cb+Cdb$$

where Cb is capacitance at the bottom of junction (linear portion) and Cdb is the dog bone portion of capacitance. Cb value is determined by PSD-NWELL junction doping and depletion width. Cdb value is determined by PSD-diluted NWELL junction doping and depletion width. Dimension X controls the dilution of NWELL and therefore the junction doping. Large X means large dog bone size which in term increases Cdb.

Referring to FIG. 23, the dog bone capacitance Cdb is regarded as a sum of components as follows:

$$Cdb=Cdb1+Cdb2+Cdb3.$$

Cdb2 is proportional to, or generally increases as a function of, X now because X is related to an area A of a "capacitor plate" of an equivalent capacitance Cdb2. The area A is approximately equal to the product of the FIG. 12 PSD oval ring circumference or perimeter multiplied by dimension X. Equivalent capacitance is imagined as having a capacitance value Cdb2 proportional to that area A that is related to dimension X, divided by a spacing w related to depletion width, e.g., between p-epi and NBL in FIG. 23. (Epsilon ∈ represents permittivity in the material having the depletion width.)

$$C = \in A/w$$

Considering FIGS. 10, 12 and 23 together, the area A for dog bone capacitance is an area value approximately equal to the product of the length of broadside perimeter or arc of the PSD viewed broadside as in FIG. 12 or FIG. 24, which length is multiplied by a cross-sectional partial perimeter of the dog bone region viewed in section as in FIG. 10. The pertinent cross-sectional part of the dog bone perimeter is that part where opposite p- and n-type materials actually abut one another to form carrier depletion in whatever is regarded as dog bone region. Specifying exactly where the sloping part of NW becomes dog bone in FIG. 12 and gets counted in the pertinent cross-sectional part of the dog bone perimeter is somewhat arbitrary and is suitably defined in a way convenient to measurement and modeling. One such way is that the pertinent cross-sectional part of the dog bone perimeter begins where the NW begins to have a unity slope (−1.0) at 45 degrees outward and down. That cross-sectional perimeter part extends down, outward across and up to the point (e.g. at FIG. 10 dielectric) where p-type material ceases to abut n-type material. (Description reverses p, n with n, p if the arrangement of doping is reversed.) The analysis can specify as few or many components Cdb_i as seem appropriate to make sense of the whole dog bone capacitance Cdb.

Comparing with a conventional, non-dog-bone, diode, the dog bone diode embodiment somewhat reduces the lateral junction capacitance to an advantageously lower dog bone capacitance value Cdb because such embodiment reduces the NWELL doping in the region.

In some embodiments, the p-epi is omitted between the n-wells. In a more general category of embodiments, PSD-NWELL doping is instead diluted in some manner at the corner of the junction, such as by diluted NWELL. Both approaches can effectively and dramatically ameliorate the diode breakdown function under high reverse-bias and thereby improve ESD performance with a dog bone region.

The oval ring of FIG. 12 can be replaced by any of the following: 1) circle, 2) ellipse, 3) rectangle, hourglass shape ("8"), or any closed shape. Indeed, an open ring (U-shape) is also contemplated, as shown in FIG. 24, wherein the open region is terminated with a different layer and junction.

FIG. 24 is a layout diagram of an open end (U) structure alternative, by way of example. Indeed, numerous geometrical structure alternatives are also comprehended for ESD diodes, transistors, and other micro-electronic ESD structures in vertical, lateral and other orientations in numerous processes such as described or shown herein, or silicon on insulator (SOI), and in other materials systems.

In various forms of testing embodiments, the junction capacitance is measured to determine that it is within an expected range. This range, first, is 1) bounded below by the sum of intended junction capacitance directly beneath the PSD layer added to or combined with a lower bound value of capacitance of the dog bone region assuming it has sufficient downward penetration and well exterior dilution of doping. Second, this range is 2) bounded above by the sum of intended junction capacitance plus the implementer's desired limit on additional capacitance due to the dog bone region size and penetration and well exterior and dilution of doping. Infrared visualization or other type of thermal testing is applied to a test chip subjected to an ESD strike, and undue junction heat dissipation around the periphery of the PSD layer should be absent. The protected circuitry should pass post-ESD functionality testing.

Aspects (See Notes Paragraph at End of this Aspects Section.)

1A. The integrated circuit structure claimed in claim 1 wherein said doped area includes a well.

1A1. The integrated circuit structure claimed in claim 1A wherein said substrate has the second conductivity type with a first-type buried layer and said well overlying said buried layer.

1B. The integrated circuit structure claimed in claim 1 wherein the junction in cross-section has a substantially curved hook shaped profile extending downward and then hooking upward.

1C. The integrated circuit structure claimed in claim 1 wherein said layer corner is spatially augmented beyond the corner with a doping profile of the second conductivity type, and said doping profile has an associated junction with a dog bone shape.

1D. The integrated circuit structure claimed in claim 1 wherein the junction profile viewed broadside includes an arc-shape and viewed in cross-section has a dog-bone shape.

1D1. The integrated circuit structure claimed in claim 1D wherein the dog-bone junction profile is resistant to premature junction breakdown under reverse-bias.

1D1A. The integrated circuit structure claimed in claim 1D1 wherein further the junction has a capacitance per unit of junction area around the diluted vicinity that is less than the corresponding junction capacitance per unit of junction area underneath said layer.

1E. The integrated circuit structure claimed in claim 1 wherein the junction under reverse bias has lines of equal potential that can have a curvature, and the junction is formed so that a place in the junction with largest potential line curvature under reverse bias creates an electric field magnitude that is less than the largest electric field magnitude elsewhere in the junction generally.

1F. The integrated circuit structure claimed in claim 1 wherein the differing conductivity types form a diode with high current operation for substantially limiting diode voltage under a reverse bias such as an ESD strike.

1G. The integrated circuit structure claimed in claim 1 wherein the doping is structured to substantially ameliorate electric equipotential line curvature and equipotential line compression so as to substantially prevent excess magnitude of the electric field at the junction corner relative to the magnitude of the electric field beneath said layer.

1G1. The integrated circuit structure claimed in claim 1G wherein the excess magnitude of electric field is substantially prevented under a reversed bias condition.

1H. The integrated circuit structure claimed in claim 1 wherein the differing conductivity types form a junction operable as an avalanche diode under reverse bias, and the junction is structured to substantially ameliorate excess magnitude of avalanche current density at the corner relative to the avalanche current density beneath said layer, whereby to reduce junction failures at the corner.

1J. The integrated circuit structure claimed in claim 1 wherein the differing conductivity types form a junction acting as a vertical diode at the corner.

1K. The integrated circuit structure claimed in claim 1 further comprising a doped epitaxial region next to the corner and having same type of conductivity as the layer, and wherein the first and second different conductivity types form a junction that has a de-activated junction corner.

1L. The integrated circuit structure claimed in claim 1 wherein the junction has a de-activated junction corner with a local resistivity exceeding the resistivity beneath the layer, whereby ESD strike current density is more uniformly distributed across the junction.

4A. The integrated circuit structure claimed in claim 4 further comprising a deeply doped region bounding said epitaxial region and having the first conductivity type.

9A. The integrated circuit structure claimed in claim 9 wherein passing an ESD strike current between said layer and said doped area beneath produces a temperature rise that exceeds a temperature rise in the vicinity below the corner.

9B. The integrated circuit structure claimed in claim 9 wherein the peak junction temperature upon an ESD strike occurs at the bottom of the layer where it overlies the doped area.

9C. The integrated circuit structure claimed in claim 9 wherein both peak ESD strike electric field and peak ESD strike current occur at the bottom of the layer where it overlies the doped area.

30A. The manufacturing process claimed in claim 30 further comprising providing an opposite-type substrate beforehand.

30A1. The manufacturing process claimed in claim 30A further comprising implanting a first-type buried layer in the substrate prior to the providing of the epitaxial layer.

30B. The manufacturing process claimed in claim 30 further comprising depositing deep first-type dopant as part of the spatial arrangement prior to performing the diffusion.

Notes about Aspects above: Aspects are paragraphs which might be offered as claims in patent prosecution. The above dependently-written Aspects have leading digits and internal dependency designations to indicate the claims or aspects to which they pertain. Aspects having no internal dependency designations have leading digits and alphanumerics to indicate the position in the ordering of claims at which they might be situated if offered as claims in prosecution.

Still other embodiments reverse the conductivity type of the various doped semiconductive regions in the Figures so that a region or doping profile that is p-type in the hereinabove description is made n-type instead, and a region or doping profile that is n-type is made p-type instead. Integrated circuit categories to which the embodiments are applicable include analog ICs, wireless ICs, digital logic ICs and among them memory and microprocessor ICs of any complexity, mixed signal ICs (digital and analog on same chip), mixed photonic and electronic ICs, MEMS (micro-electro-mechanical systems) ICs, digital light processing integrated circuits (e.g., with numerous physically controllable small mirrors) and all other ICs to which such diodes may be applicable for ESD protection and any other purpose for which they may be useful. These and numerous other embodiments are contemplated wherein the geometry and organization of the regions are varied from those shown but otherwise fall within the spirit and scope of the invention and equivalents thereof.

What is claimed is:

1. An electrostatic discharge diode structure in an integrated circuit comprising:
   A. an N-type buried layer in a semiconductor substrate;
   B. a deep N-type inplant region in the substrate extending down from a first level of the substrate to the N-type buried layer;
   C. a first N well region formed in the substrate and extending down to the N-type buried layer;
   D. a second N well region formed in the substrate and extending down from the first level of the substrate to the N-type buried layer, the second N well region being formed next to the deep N-type inplant region;
   E. a P-type epitaxial region formed in the substrate and extending down from the first level of the substrate to the N-type buried layer between the first N well region and the second N well region; and
   F. a P-type source/drain region formed in the substrate over the first N well region and a portion of the P-type epitaxial region.

2. The diode structure of claim 1 including a metal region formed over the P-type source/drain region and a dielectric region formed over a portion of the P-type source drain region, the P-type epitaxial region, and the second N well region.

3. The diode structure of claim 1 in which the P-type source/drain region has an oval shape in plan view with the P-type epitaxial region being arranged around the circumference of the P-type source drain region.

4. The diode structure of claim 1 including a reference ground is coupled to the P-type source/drain region and a pin of a circuit is coupled to the deep N-type inplant region.

5. The diode structure of claim 1 in which the P-type source/drain region has an end with a round shape in plan view with the P-type epitaxial region being arranged around the circumference of the round shape of the P-type source drain region.

* * * * *